United States Patent [19]

Niles et al.

[11] 4,390,221

[45] Jun. 28, 1983

[54] MODULAR CONNECTOR ASSEMBLY HAVING AN ELECTRICAL CONTACT

[75] Inventors: Paul D. Niles, Bainbridge; Richard W. Normann, Otego, both of N.Y.

[73] Assignee: The Bendix Corporation, Southfield, Mich.

[21] Appl. No.: 257,023

[22] Filed: Apr. 24, 1981

[51] Int. Cl.[3] .......... H05K 3/34

[52] U.S. Cl. .......... 339/17 M; 29/864

[58] Field of Search .......... 339/17 R, 17 C, 17 M, 339/17 LC, 17 LM, 49 R; 228/180 R, 215; 29/864

[56] References Cited

U.S. PATENT DOCUMENTS

| | | | |
|---|---|---|---|
| 2,913,634 | 11/1959 | Scoville | 317/101 |
| 2,977,562 | 3/1961 | Benson | 339/17 |
| 3,028,573 | 4/1962 | Stoehr | 339/17 |
| 3,163,709 | 12/1964 | Fox | 174/68.5 |
| 3,205,469 | 9/1965 | Frank et al. | 339/18 |
| 3,260,791 | 7/1966 | Shelley | 339/276 A |
| 3,270,251 | 8/1966 | Evans | 317/101 |
| 3,568,001 | 3/1971 | Straus | 317/101 |
| 3,725,844 | 4/1973 | McKeown et al. | 339/49 R |
| 3,850,491 | 11/1974 | Mouissie | 339/17 C |
| 3,904,934 | 9/1975 | Martin | 317/101 |
| 4,127,312 | 11/1978 | Fleischhacker et al. | 339/99 R |
| 4,149,764 | 4/1979 | Mattingly, Jr. | 339/17 M |

FOREIGN PATENT DOCUMENTS

| | | |
|---|---|---|
| 7924512 | 10/1979 | France . |
| 2006550 | 5/1979 | United Kingdom . |

*Primary Examiner*—Eugene F. Desmond
*Assistant Examiner*—David Pirlot
*Attorney, Agent, or Firm*—Charles D. Lacina

[57] ABSTRACT

A modular connector assembly (50) combination characterized by a printed circuit board (60) having a plurality of apertures (66) extending between the surfaces thereof and with a circuit being printed on one of the panel surfaces; an interconnection device (70) mounted to the printed circuit board, the interconnection device being of dielectric material and associating a plurality of passages (76) extending therethrough with the apertures; and a contact (10) mounted within some of the passages of the interconnection device, the contact being of the type comprising a holder (20) of solderable material, a plurality of axial wires of conductive material secured medially of their ends (32, 34) in the holder and a sleeve (40) of non-solderable material extending forwardly of the holder, wavesoldering about an end portion of the holder extending through the aperture (66) mounting the contact and the interconnection device to the printed circuit board.

4 Claims, 4 Drawing Figures

FIG. 1
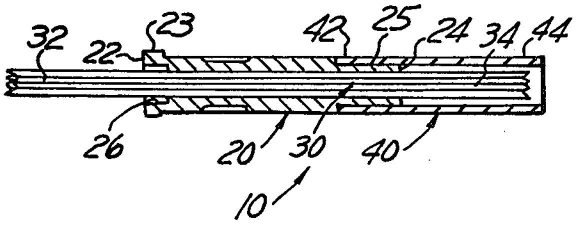
FIG. 3
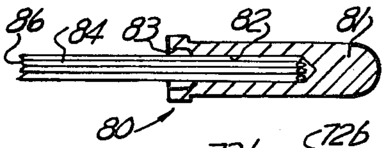
FIG. 2
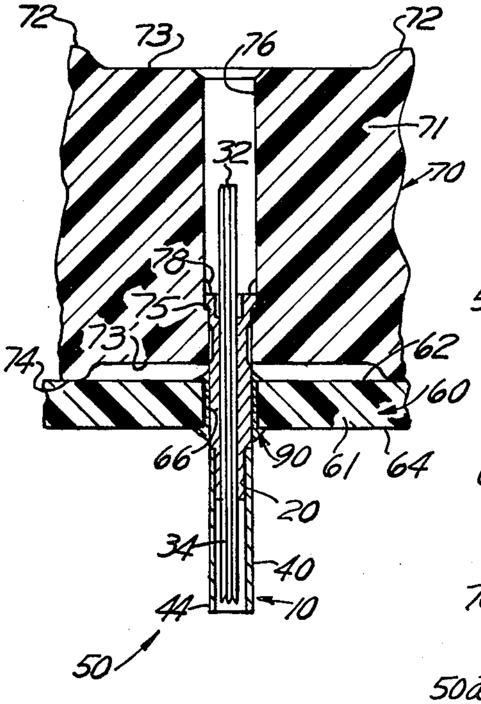
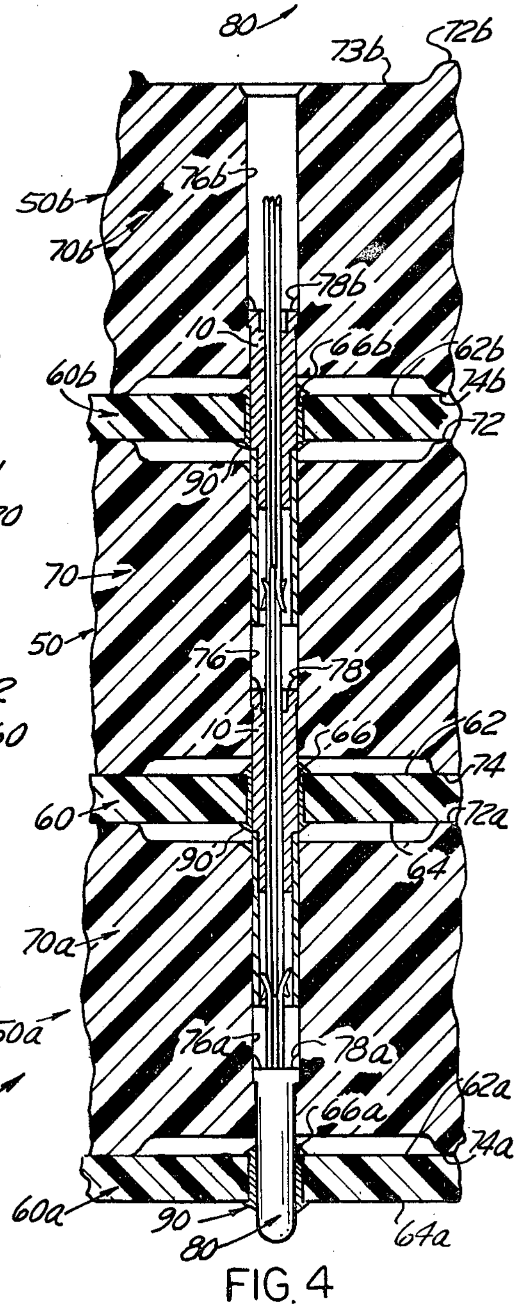
FIG. 4

MODULAR CONNECTOR ASSEMBLY HAVING AN ELECTRICAL CONTACT

This invention relates to a modular connector assembly for electrically interconnecting printed circuit boards and, more particularly, to double-ended electrical contacts for electrically and mechanically interconnecting circuit paths of circuit boards stacked in spaced-apart relation.

Stacking of printed circuit boards in electronic packaging is becoming more common in order to condense the size of the package. At the present time, one expedient for electrically interconnecting printed circuitry on the boards is by straight copper posts which extend through plated holes in the stacked printed circuit boards. Reflow solder techniques is often utilized to electrically connect the copper posts in the plated-through holes. One soldered stacked printed circuit board assembly is disclosed in U.S. Pat. No. 2,913,634 issued Nov. 17, 1959 and entitled "Electronic Modular Units". Such assemblies have the disadvantage that in order to repair any board within the stack, all the copper posts must be removed from the stack of boards in order to remove the board which requires repair. This requires removal of all the solder joints between copper posts and the printed circuit boards, which is time consuming and costly. Furthermore, precise board spacing is difficult to maintain and tight manufacturing tolerances must be maintained in order to avoid misalignment of the plated-through holes in the boards which receive the copper posts.

In some cases, the posts interference fit in the holes, increasing the mating forces and the release forces required by a user. Low mating forces and release forces is usually desired for ease of assembly and repair.

Sometimes metal spacers surround the rods for maintaining the boards in a predetermined spaced relationship. While satisfactory, elimination of extra parts is desirable.

A stacked board assembly in which the boards are easily separated for repair, and do not require separate spacers for maintaining the spatial relationship between the boards is disclosed in U.S. Pat. No. 4,149,764, issued Apr. 17, 1979 to Mattingly and entitled "Stacked Printed Circuit Board Assembly and Contacts therefor". There a double-ended pin and socket contact allowed a stack of circuit boards to be electrically interconnected and mechanically spaced apart without maintaining tight manufacturing tolerances on the boards. Although possibly satisfactory for the use as desired there, pin and socket contacts require large mating forces and in a typical installation involving fifty or more pins, the force required to mate becomes excessive. Such excessive forces would limit the number of boards which could practically be stacked in a field environment.

Another approach to the problem of stacking connectors is shown in U.S. Pat. No. 2,977,562 to Benson and entitled "Dip Soldered Printed Circuit Sockets", issuing Mar. 28, 1961. There a dielectric housing positioned a plurality of pin and socket type contacts with a panel and the combination dipped into a solder bath. As above, such contacts require large mating forces and socket contacts would not be as suitable in all cases to mass soldering techniques. An open-ended socket contact when dipped into solder runs a risk of being plugged-up since the socket barrel could be in the order of 0.10 inches diameter. Reworking of solder can be time consuming to uncover and repair.

A low mating force electrical contact is shown in U.S. Pat. No. 3,725,844, issuing Apr. 3, 1973 to McKeown et al. While satisfactory for the purposes intended, direct stackability of the contacts with printed circuit boards was not envisioned and contact mating required separate collars. Separate components are not desirable in the field and a self contained assembly which can be stacked would be desirable.

DISCLOSURE OF THE INVENTION

The invention as claimed is intended to remedy these drawbacks.

The invention provides a wavesoldered modular connector assembly between a circuit board, an interconnection device having a plurality of passages arranged therethrough and a plurality of double-ended brush-type contacts disposed in a selected number of the passages, the wavesoldering electrically connecting a contact with a circuit path on the board and physically securing the board, the device and the contacts together for mating with another like assembly. The contact includes a plurality of straight wires secured together by a holder of solderable material to define a mateable brush, the brush having one end exposed but protected in the interconnection device passage and the other end enclosed and protected by a sleeve of non-solderable material. When the contact is mounted in the interconnection device and positioned to the circuit board, the sleeve and an end portion of the holder extend through an aperture of the printed circuit board. During wavesoldering, solder forms about the extended end portion of the holder but does not attach to the sleeve, thereby securing the contact to board. The sleeve extending from the circuit board is sized to enter a like passage of another interconnection device and to mate with the exposed brush ends of the other contact disposed therein whereupon selected circuit paths and/or conductors on one or both of the assemblies are electrically interconnected.

One advantage of such an electrical connector is low mating forces yet retaining high density contact packaging.

Another advantage of an assembly is economy of assembly and ease of repair in the field.

DETAILED DESCRIPTION OF THE INVENTION

FIG. 1 illustrates an electrical contact according to this invention.

FIG. 2 illustrates a modular electrical connector assembly according to this invention.

FIG. 3 illustrates an alternate embodiment of an electrical contact according to this invention.

FIG. 4 illustrates a stack of modular electrical connector assemblies according to this invention.

Referring now to the drawings, FIG. 1 illustrates an electrical contact embodying the principles of this invention. The electrical contact 10 comprises a holder 20 machined from conductive material having opposite ends 22, 24 and an interior bore 26 extending between the ends. Holder end 22 includes a raised annular wall 23 used for mounting purposes. Holder end 24 includes a recessed annular wall 25 for receiving another contact part. The holder material is conductive and has a finish (e.g., plating) that has good solderability and could include beryllium copper or other materials well known in the art. A plurality of straight axial wires 30 of conductive material are secured into the holder 20 such that their axes are aligned in parallel relation and arranged into a brush with the opposite ends of the wires extending axially outward from the ends of the holder. A first brush end 32 extends outwardly of the holder end 22 and a second brush end 34 extends outwardly of the other holder end 24. A sleeve 40 of non-solderable material has a rear end portion 42 fitted about the recessed annular wall 25 and a forward end 44 protectively surrounding brush end 34. The sleeve preferably is of stainless steel although, depending on the application, dielectric materials could be employed. Each of the wire ends 34 are spaced rearwardly of the sleeve forward end 44.

FIG. 2 illustrates a modular electrical connector assembly 50 according to this invention and comprises a printed circuit board 60, an interconnection device 70 and the electrical contact 10.

The printed circuit board 60 comprises a panel 61 of dielectric material having a top surface 62, a bottom surface 64 and a plurality of plated apertures 66 (one shown) extending between the surfaces of the panel. The top surface 62 has a circuit printed thereon defining one or more electrical circuit paths between conductive elements (not shown) on the board. Conductive elements on the board (not shown) would be plated.

The interconnection device 70 comprises a body 71 of dielectric material having a top face 72, a bottom face 74 and a plurality of passages 76 (one shown) extending between the faces of the body. The passage includes a resilient lance 78 that extends outwardly from the passage wall and a shoulder 75, and lance being spaced from the shoulder so as to define a arrangement for retaining the contact in the passage. The passages 76 in the interconnection device are arranged to register with the apertures 66 in the circuit board.

As shown, one contact 10 is mounted in the passage 76 in such fashion that the exposed end 32 of the brush extends within the passage and the end 34 of the brush protected by the sleeve extending beyond the bottom surface 64 of the circuit board, the sleeve 40 extending outwardly of the top face 74 and through the aperture in a clearance fit. By this placement, a certain portion of the contact holder is exposed to extend beyond the bottom surface 64. This extended end portion could be as little as 0.020 inches and forms an exposed portion for soldering that does not include the sleeve. Solder 90 wets the extended end portion and forms a meniscus about the holder in a region below the bottom surface 64, in the plated operture 66, and in a region above the top surface 62. The top face 72 of the interconnection device 70 is provided with a recess 73 about the passage 76 exit which serves to provide an air space for heat dissipation from the circuit board. The bottom face 74 is provided with a recess 73 about the other passage 76 exit for the purpose of flux removal after soldering using suitable solvents.

The modular electrical connector assembly 50 is formed by placing the contacts in their respective passages and positioning the interconnection device over the circuit board. These parts would then be secured together by an appropriate fixture (not shown) and placed in a waversoldering machine, the bottom surface of the board, the exposed sleeve and the extended end portion of the holder being passed through a solder wave. Only the extended end portion of the holder is "wetted" by the solder. The sleeve, being of "non-solderable" material, is not "wetted" by the solder. As a result of this, the solder will flow into the annular gap formed by the aperture 66 around the holder and attach to both the extended end portion of the holder and to the holder disposed in the aperture above the sleeve to thereby solder the contacts to the circuit board, thus mounting the circuit board to the interconnection device and providing the modular connector assembly according to this invention.

The solder meniscus is controlled by the solder wettable material used and by dimensioning the solder wettable area with the circuit board thickness in mind. In one application a wettable holder end portion that extended 0.015–0.030 inches below the board was found to be satisfactory. The wettable extended portion of the holder would not extend a distance greater than the space between the face 72 and the stand off formed by recess 73.

FIG. 3 shows an end contact 80 for use in a modular assembly that is to be at the bottom of a stack of similar modular connector assemblies 50 and comprises a cap-shaped holder 81 including a socket 82 and having a plurality of straight axial wires 84 extending to mateable ends 86 from an open end 83 of the socket. The holder 81 (or cap) is of solderable material and forms that portion of the contact exposed to solder during wavesoldering.

A plurality of modular connector assemblies are then capable of being stacked, one on top of the other. In the field, due to low mating forces in the densely packed contacts, one or more boards can be exchanged depending on the circuit paths that are to be connected.

FIG. 4 shows an electrical connector assembly 100 comprising a stack of modular connector assemblies and includes a first (bottom or end) assembly 50*a*, a second (intermediate) assembly 50 (of FIG. 2) and a third (top) assembly 50*b*. Selective placement of contacts in the respective interconnection devices 70*a*, 70, 70*b* allows circuit paths on more than one circuit board 60*a*, 60, 60*b* to be electrically interconnected. The top modular connector assembly 50*b* includes contact 10 of FIG. 1, the holder 20 being soldered to its associated printed circuit board aperture 66*b* and the forward end of sleeve 40 mating with the other end of a like contact 10 of assembly 50. The bottom modular connector assembly 50*a* includes contact 80, one end of the contact being soldered in its associated circuit board aperture 66*a* and the other end mating with the forward end of the sleeve of contact 10 of assembly 50. In this manner, circuit paths on circuit boards 60*a*, 60 are electrically interconnected. The wires of one contact will spreadably intermingle with the wires of the other contact. Further, if another modular connector assembly 50*c* (not shown) like assembly 50 of FIG. 2 were stacked on top of modular connector assembly 50*b*, then circuit paths on assemblies 50*c*, 50 and 50*a* could be electrically interconnected.

While a preferred embodiment of this invention has been disclosed, it will be apparent to those skilled in the art, that changes may be made to the invention as set forth in the appended claims, and in some instances, certain features of the invention may be used to advantage without corresponding use of other features. Accordingly, it is intended that the illustrative and descriptive materials herein will be used to illustrate the principles of the invention and not to limit the scope thereof.

We claim:

1. A modular connector assembly (50) characterized by:

a printed circuit board (60) comprised of a dielectric material and having top and bottom surfaces (62, 64), a plurality of apertures (66) extending between the surfaces of the board and a circuit printed on one of the surfaces;

an interconnection device (70) mounted to the printed circuit board, the interconnection device comprised of a dielectric material and having top and bottom faces (72, 74) and a plurality of passages (76) extending therethrough arranged in a predetermined pattern; and a contact (10) mounted within one of the passages of said interconnection device, said contact (10) being of the type comprising a holder (20) of solderable material and a sleeve (40) comprised of stainless steel, the sleeve having one end (42) secured to the holder and another end (44) extending forwardly of the holder, the sleeve and an end portion of the holder extending through the aperture (66), the extended portion of the holder wavesoldered to the printed circuit board.

2. An assembly as required by claim 1 wherein the contact includes a plurality of axial wires (30) of conductive material secured medially of their ends (32, 34) in the holder, the wire ends forming a mateable brush-type contact.

3. An electrical connector assembly (100) for connecting a first electrical circuit path in electrical circuit relationship with a second electrical circuit path, the assembly characterized by:

a pair of printed circuit boards (60, 60*a*) comprised of dielectric material and each having top and bottom surfaces (62, 62*a*; 64, 64*a*) and an aperture (66, 66*a*) extending between its surfaces, one of the surfaces of each having one of said circuit paths;

a pair of interconnection devices (70, 70*a*) comprised of dielectric material and each having top and bottom faces (72, 72*a*; 74, 74*a*) and a passage (76, 76*a*) extending between its faces, the apertures arranged to correspond with the passages and with the circuit paths in a predetermined pattern; and a pair of contacts (10, 80) of the type including a plurality of axial wires (30, 84) having one of their ends (34, 84) formed into a mateable brush, one contact (10) being mounted in the passage (76) of one interconnection device (70) and further including a holder (20) of solderable material secured about the wires (30) and a sleeve (40) comprised of stainless steel material secured to the holder, the sleeve extending forwardly of the holder and surrounding the mateable brush, the sleeve and an end portion of the holder extending through the aperture (66) of one circuit board (60), the other contact (80) being mounted in the passage (76*a*) of the other interconnection device (70*a*) and further including a second holder (81) of a solderable material secured about the wires (84), the second holder (81) being disposed in the aperture (66*a*) of the other circuit board (60*a*), the extended end portion of the said one contact and the second holder of said other contact being wavesoldered to its respective printed circuit board whereby the mateable brush ends of said one contact (10) intermingle with the mateable brush ends (84) of said other contact (80) and said contacts selectively interconnect the printed circuits on each of the boards.

4. A method of making a modular connector assembly (50) of the type including a board (60) comprised of a dielectric material and having top and bottom surfaces (62, 64), a plurality of apertures (66) extending between the surfaces and a circuit printed on one of the surfaces and an electrical contact (10) including a holder (20) comprised of a solderable material and a plurality of conductive wires (30) secured medially of their ends (32, 34) within the holder, the method characterized by:

providing an interconnection device (70) of the type comprised of a dielectric material and having top and bottom faces (72, 74) and a plurality of passages (76) extending between the faces and arranged to register with the apertures (66);

mounting a separate sleeve (40) comprised of a nonsolderable material to one end (25) of the holder (20) such that the sleeve surrounds and extends slightly forward of one of the wire ends (34), the other wire ends (32) being exposed;

mounting the holder (20) with sleeve (40) into one of the passages (76) of the interconnection device (70) such that the sleeve (40) extends forwardly of the bottom face (74) and the other wire ends (34) extend into the passage;

superposing the bottom face (74) of the interconnection device (70) over the top surface (62) of the board (60) such that the sleeve and a small solderable portion of the holder extends beyond the bottom surface (64) of the board; and wavesoldering the bottom surface of the board, whereby solder attaches to the solderable portion of the holder to form an electrical mechanical connection therewith but does not attach to the sleeve.

* * * * *